(12) United States Patent
Forrest et al.

(10) Patent No.: US 11,145,834 B2
(45) Date of Patent: Oct. 12, 2021

(54) HIGH EFFICIENCY MULTI-JUNCTION SMALL-MOLECULE PHOTOVOLTAIC DEVICES

(71) Applicant: The Regents of the University of Michigan, Ann Arbor, MI (US)

(72) Inventors: Stephen R. Forrest, Ann Arbor, MI (US); Xiaozhou Che, Ann Arbor, MI (US); Xin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 136 days.

(21) Appl. No.: 15/111,249

(22) PCT Filed: Jan. 15, 2015

(86) PCT No.: PCT/US2015/011556
§ 371 (c)(1),
(2) Date: Jul. 13, 2016

(87) PCT Pub. No.: WO2015/109069
PCT Pub. Date: Jul. 23, 2015

(65) Prior Publication Data
US 2016/0343966 A1    Nov. 24, 2016

Related U.S. Application Data

(60) Provisional application No. 61/927,934, filed on Jan. 15, 2014, provisional application No. 61/928,048, (Continued)

(51) Int. Cl.
*H01L 51/42* (2006.01)
*H01L 51/00* (2006.01)
*H01G 9/20* (2006.01)

(52) U.S. Cl.
CPC ....... *H01L 51/4246* (2013.01); *H01G 9/2059* (2013.01); *H01L 51/001* (2013.01);
(Continued)

(58) Field of Classification Search
CPC .................................................. H01L 51/4246
See application file for complete search history.

(56) References Cited

U.S. PATENT DOCUMENTS

2006/0027802 A1    2/2006  Forrest et al.
2010/0084011 A1*   4/2010  Forrest .................. B82Y 10/00
                                                      136/255
(Continued)

FOREIGN PATENT DOCUMENTS

WO    WO 2012/154557 A2    11/2012

OTHER PUBLICATIONS

Chen et al., "Vacuum-Deposited Small-Molecule Organic Solar Cells with High Power Conversion Efficiencies by Judicious Molecular Design and Device Optimization", J. Am. Chem. Soc. 2012, 134, 13616-13623.*

(Continued)

*Primary Examiner* — Tae-Sik Kang
(74) *Attorney, Agent, or Firm* — Finnegan, Henderson, Farabow, Garrett & Dunner LLP

(57) ABSTRACT

High efficiency multi-junction small-molecule organic photovoltaic devices and methods of fabricating the same are disclosed herein. Design considerations for improving spectral coverage and light-harvesting efficiency using the multi-junction devices are also disclosed.

23 Claims, 8 Drawing Sheets

Related U.S. Application Data filed on Jan. 16, 2014, provisional application No. 61/975,626, filed on Apr. 4, 2014, provisional application No. 61/976,942, filed on Apr. 8, 2014, provisional application No. 62/026,275, filed on Jul. 18, 2014.

(52) U.S. Cl.
CPC ...... *H01L 51/0046* (2013.01); *H01L 51/0056* (2013.01); *H01L 51/0061* (2013.01); *H01L 51/0069* (2013.01); *Y02E 10/549* (2013.01)

(56) References Cited

U.S. PATENT DOCUMENTS

| 2012/0241717 A1* | 9/2012 | Jones | B82Y 10/00 257/12 |
|---|---|---|---|
| 2013/0240027 A1 | 9/2013 | Zakhidov et al. | |

OTHER PUBLICATIONS

International Search Report & Written Opinion, PCT/US2015/011556, dated Mar. 31, 2015.

Yakimov et al., *High Photovoltage Multiple-Heterojunction Organic Solar Cells Incorporating Interfacial Metallic Nanoclusters*, Applied Physics Letters, American Institute of Physics, US, vol. 80, No. 9, pp. 1667-1669 (Mar. 4, 2002).

Chen et al., *Vacuum-Deposited Small-Molecule Organic Solar Cells with High Power Conversion Efficiencies by Judicious Molecular Design and Device Optimization*, Journal of the American Chemical Society, vol. 134, No. 33, pp. 13616-13623 (Jun. 26, 2012).

\* cited by examiner

FIG. 2
DBP
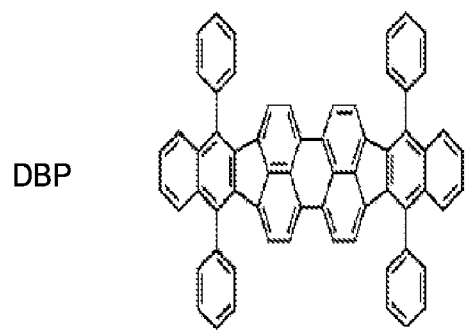
DTDCTB
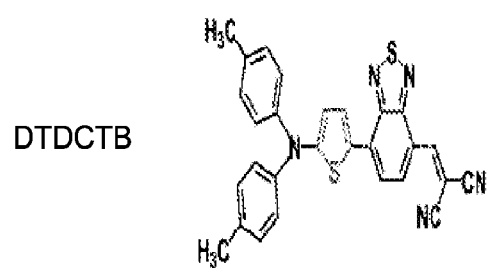
DTDCPB
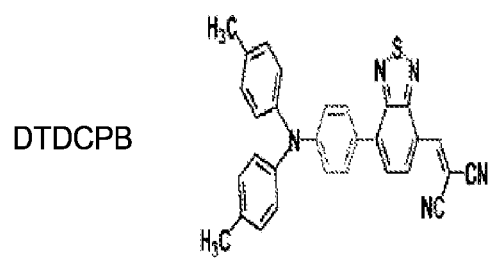

*FIG. 3A*          *FIG. 3B*
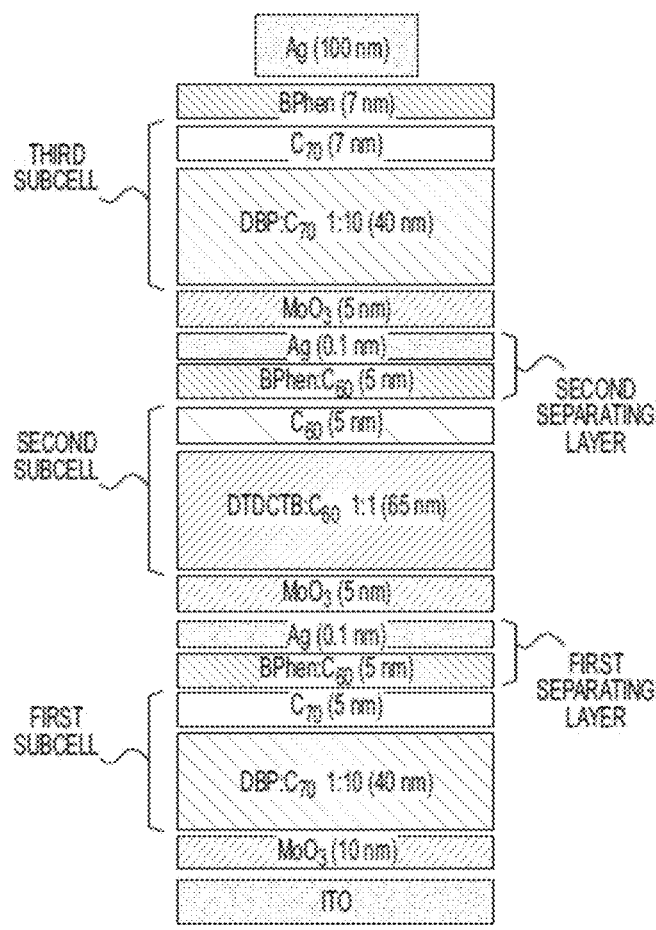
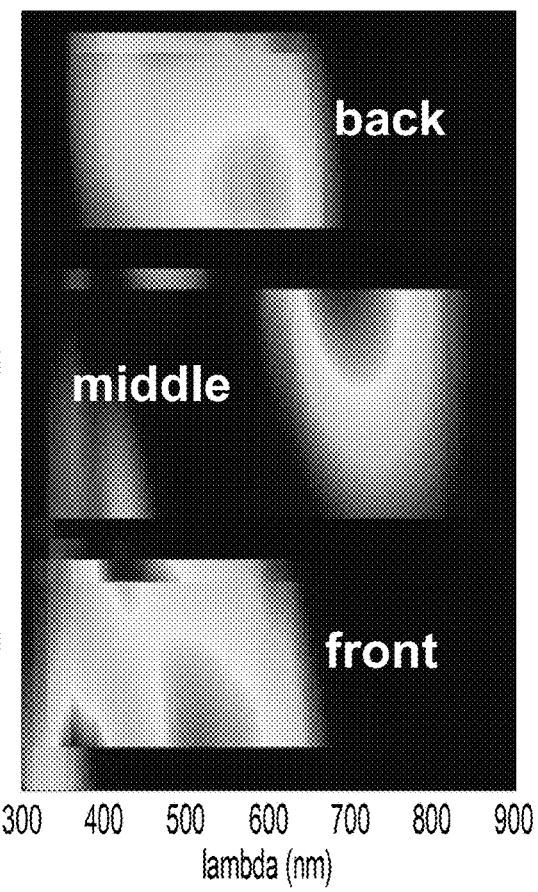

*FIG. 6A* *FIG. 6B*
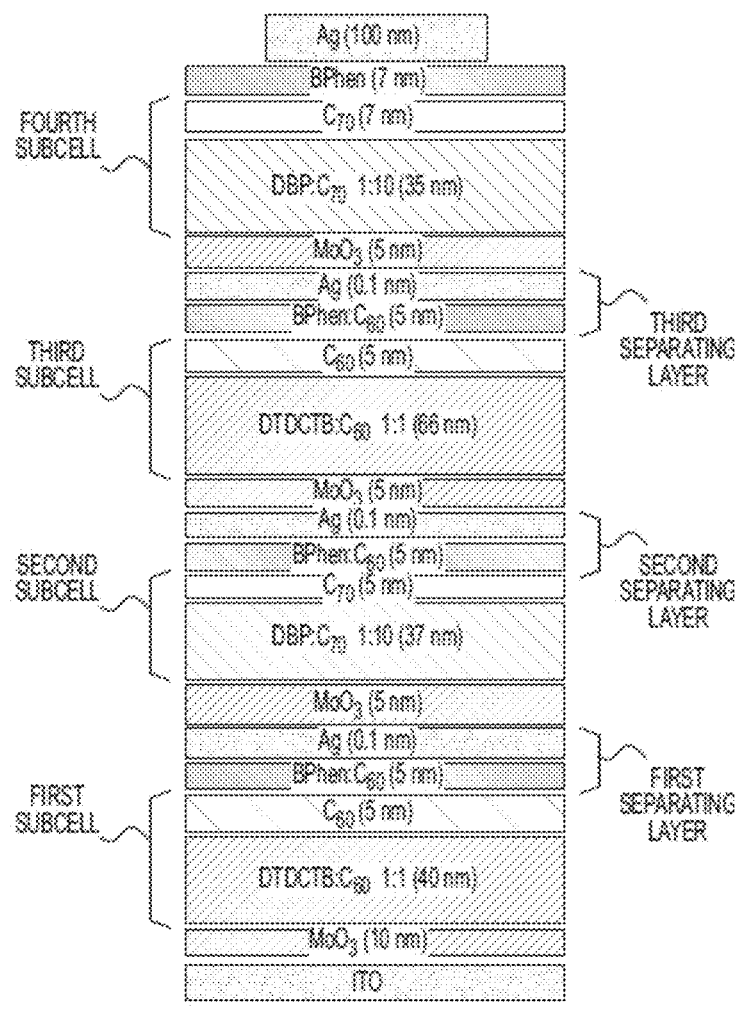
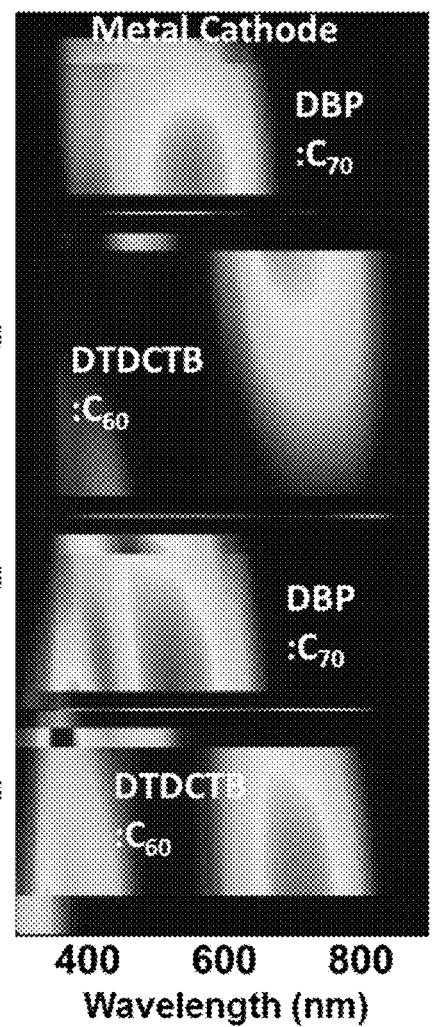

HIGH EFFICIENCY MULTI-JUNCTION SMALL-MOLECULE PHOTOVOLTAIC DEVICES

CROSS-REFERENCE TO RELATED APPLICATION

This application claims the benefit of U.S. Provisional Application No. 61/927,934, filed Jan. 15, 2014, U.S. Provisional Application No. 61/928,048, filed Jan. 16, 2014, U.S. Provisional Application No. 61/975,626, filed Apr. 4, 2014, U.S. Provisional Application No. 61/976,942, filed Apr. 8, 2014, and U.S. Provisional Application No. 62/026,275, filed Jul. 18, 2014, all of which are incorporated herein by reference in their entirety.

STATEMENT REGARDING FEDERALLY SPONSORED RESEARCH

This invention was made with U.S. Government support under Contract Nos. DE-EE0005310 and DE-SC0000957 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to organic optoelectronic devices and, in particular, to multi-junction small-molecule photovoltaic devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with the specific applications requirements.

PV devices may be optimized for maximum electrical power generation under standard illumination conditions (i.e., Standard Test Conditions which are 1000 W/m$^2$, AM 1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes, (2) the photovoltage under open circuit conditions, i.e., the open circuit voltage $V_{OC}$, in Volts, and (3) the fill factor, FF.

$I_{SC}$ is often listed alternatively as $J_{SC}$, the short circuit current density, in mA/cm$^2$, to remove the dependency of the value on the area of the solar cell. Accordingly, $I_{SC}$ can be readily converted to or derived from $J_{SC}$ by dividing by or multiplying by, respectively, the area of the PV device.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, VI. The maximum total power generated by a PV device is inherently incapable of exceeding the product, $I_{SC}V_{OC}$. When the load value is optimized for maximum power extraction, the current and voltage have the values, $I_{MAX}$ and $V_{MAX}$ respectively.

A figure of merit for PV devices is the fill factor, FF, defined as:

$$FF=(I_{MAX}V_{MAX})/(I_{SC}V_{OC})$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P=FF(I_{SC}V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

Carrier generation in organic photovoltaics (OPVs) requires exciton generation, diffusion, and ionization or collection. There is an efficiency η associated with each of these processes. The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

OPVs offer a low-cost, light-weight, and mechanically flexible route to solar energy conversion. Compared to polymer OPVs, small-molecule OPVs share the advantages of using materials with well-defined molecular structures and weights. Hence, small molecules provide a simple pathway for purification, and are compatible with deposition of multiple layers using highly controlled thermal evaporation without concern for dissolving (and hence damaging) previously deposited layers or subcells.

Single-junction OPVs can suffer from narrow absorption range, low open-circuit voltages ($V_{OC}$) and large photon energy losses, ultimately limiting their power conversion efficiencies. One means to improve cell performance is to harvest more of the solar spectrum by using a multi-junction cell. For example, a tandem (i.e. two-subcell) polymer OPV has been shown to have a power conversion efficiency of 10.6%. See J. You et al., "A polymer tandem solar cell with 10.6% power conversion efficiency," *Nat. Commun.*, 4, 1446 (2013). Further, a triple-junction polymer OPV achieving a 9.6% power conversion efficiency has been demonstrated. See W. Li et al., "Efficient Tandem and Triple-Junction Polymer Solar Cells," *Journal of the American Chemical Society*, 135, 5529-5532 (2013). This triple-junction polymer OPV, however, divides the back subcell into two thinner subcells, which results in a loss in quantum efficiency since the layer thicknesses are limited by solution processing considerations.

In accordance with the present disclosure, small-molecule materials, which can be vacuum-deposited, avoid this problem, allowing for the fabrication of OPVs with virtually an unlimited number of subcells. Thus, disclosed herein are multi-junction OPVs comprising three or more subcells, wherein at least one, two, three or more of the subcells comprise small-molecule materials.

In one aspect of the present disclosure, a multi-junction organic photovoltaic device comprises two electrodes in superposed relation; a first subcell comprising a first organic donor and a first organic acceptor forming a first donor-acceptor heterojunction; a second subcell comprising a second organic donor and a second organic acceptor forming a second donor-acceptor heterojunction; a third subcell comprising a second organic donor and a second organic acceptor forming a third donor-acceptor heterojunction; a first separating layer; and a second separating layer, wherein the first, second, and third subcells are located between the two electrodes, the second subcell is located between the first and third subcells, the first separating layer is located between the first and second subcells, the second separating layer is located between the second and third subcells, and at least two of the subcells comprise small-molecule materials.

In some embodiments, the first, second, and third donors each principally absorbs at non-overlapping wavelengths. In other embodiments, the first, second, and third donors principally absorb at one or more overlapping wavelengths, and the first, second, and third subcells are positioned at different optical interference maxima within the one or more overlapping wavelengths. In some embodiments, only two of the first, second, and third donors principally absorb at one or more overlapping wavelengths, and the subcells corresponding to the two donors that principally absorb at the one or more overlapping wavelengths are positioned at different optical interference maxima within the one or more overlapping wavelengths.

In another aspect, a multi-junction organic photovoltaic device comprises: two electrodes in superposed relation; a first subcell comprising a first organic donor and a first organic acceptor forming a first donor-acceptor heterojunction; a second subcell comprising a second organic donor and a second organic acceptor forming a second donor-acceptor heterojunction; a third subcell comprising a third organic donor and a third organic acceptor forming a third donor-acceptor heterojunction; a fourth subcell comprising a fourth organic donor and a fourth organic acceptor forming a fourth donor-acceptor heterojunction; a first separating layer; a second separating layer; and a third separating layer, wherein the first, second, third, and fourth subcells are located between the two electrodes, the second subcell is located between the first and third subcells, the third subcell is located between the second and fourth subcells, the first separating layer is located between the first and second subcells, the second separating layer is located between the second and third subcells, the third separating layer is located between the third and fourth subcells, and three or all four of the subcells comprise small-molecule materials.

In some embodiments, two or more of the donors principally absorb at one or more first overlapping wavelengths, and the subcells that correspond to the donor materials that principally absorb at the one or more first overlapping wavelengths are positioned at different optical interference maxima within the one or more first overlapping wavelengths. In some embodiments, another two of the donors principally absorb at one or more second overlapping wavelengths, and the subcells that correspond to the donor materials that principally absorb at the one or more second overlapping wavelengths are positioned at different optical interference maxima within the one or more second overlapping wavelengths.

In another aspect, a multi-junction organic photovoltaic device comprises: two electrodes in superposed relation; five or more subcells located between the electrodes, wherein each pair of adjacent subcells is separated by a separating layer, two or more of the subcells each comprise a donor that principally absorbs at one or more first overlapping wavelengths, and each of the subcells that comprise a donor that principally absorbs at the one or more first overlapping wavelengths are positioned at different optical interference maxima within the one or more first overlapping wavelengths.

In another aspect, a method of fabricating a multi-junction organic photovoltaic device comprises: depositing a first subcell over a first electrode, depositing a first separating layer over the first subcell, depositing a second subcell over the first separating layer, depositing a second separating layer over the second subcell, depositing a third subcell over the second separating layer, and depositing a second electrode over the third subcell, wherein each of the subcells comprises materials chosen from small-molecule materials.

In another aspect, a method of fabricating a multi-junction organic photovoltaic device comprises: depositing four or more subcells over a first electrode and depositing a second electrode over the four or more subcells, wherein each adjacent pair of the subcells is separated by a separating layer, and wherein each of the subcells comprises small-molecule materials.

The foregoing and other features of the present disclosure will be more readily apparent from the following detailed description of exemplary embodiments, taken in conjunction with the attached figures. It will be noted that for convenience all illustrations of structures show the height dimension exaggerated in relation to the width.

The accompanying figures are incorporated in and constitute a part of this specification.

FIG. 2 shows the chemical structures of DBP, DTDCTB, and DTDCPB.

FIG. 3A provides an example of a triple-junction OPV according to the present disclosure; FIG. 3B shows the calculated absorption spectra for the triple-junction device of FIG. 3A.

Figure 4A:
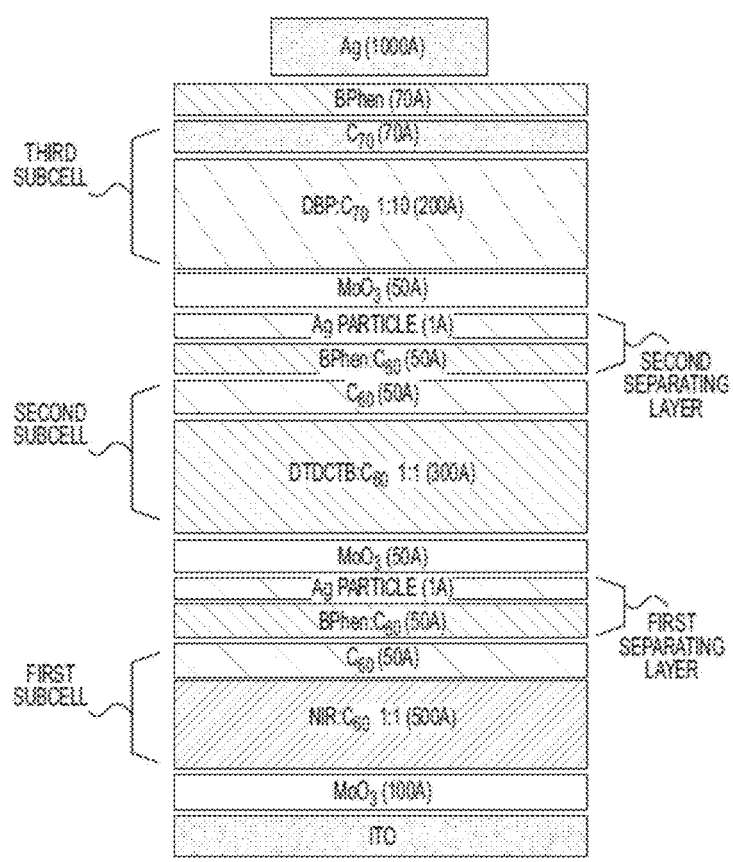
Figure 4B:
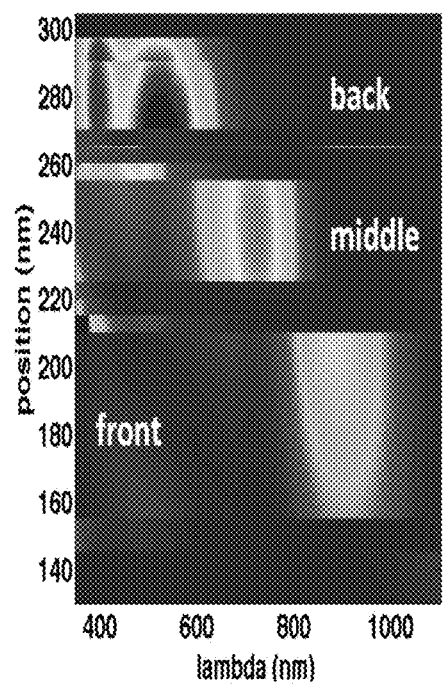

FIG. 4A provides an example of a triple-junction OPV according to the present disclosure; FIG. 4B shows the calculated absorption spectra for the triple-junction device of FIG. 4A.

Figure 5:
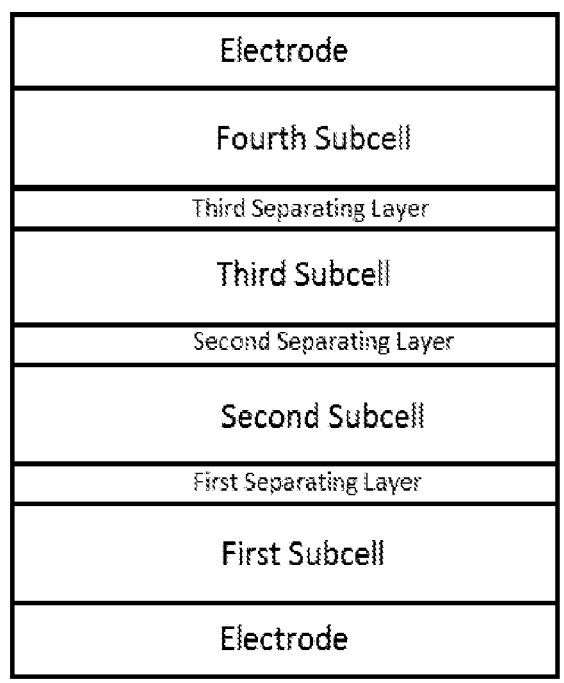

FIG. 5 shows an exemplary device schematic of a four-junction OPV according to the present disclosure.

FIG. 6A provides an example of a four-junction OPV according to the present disclosure; FIG. 6B shows the calculated absorption spectra for the four-junction device of FIG. 6A.

Figure 7:
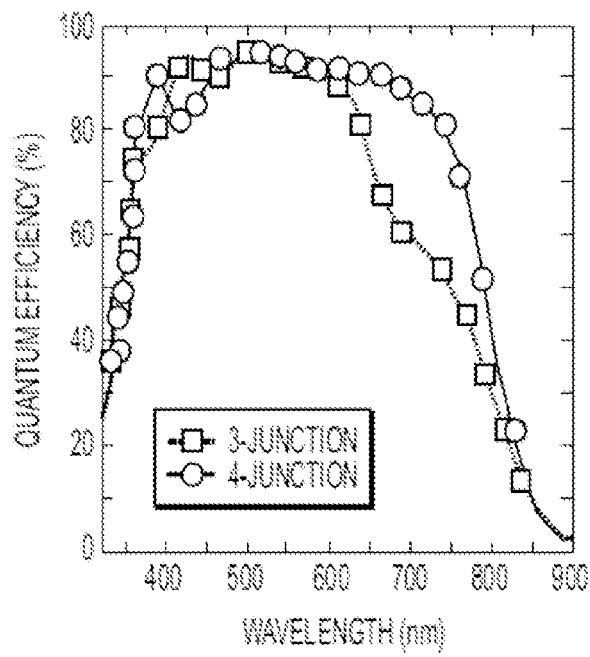

FIG. 7 shows the simulated quantum efficiency for the triple-junction and four-junction devices.

Figure 8:
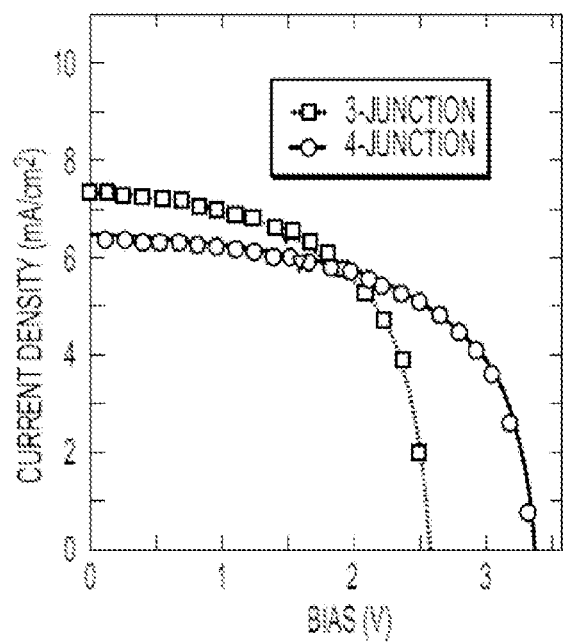

FIG. 8 shows the measured current density vs. voltage (J-V) characteristics for the triple-junction and four-junction devices.

Figure 9:
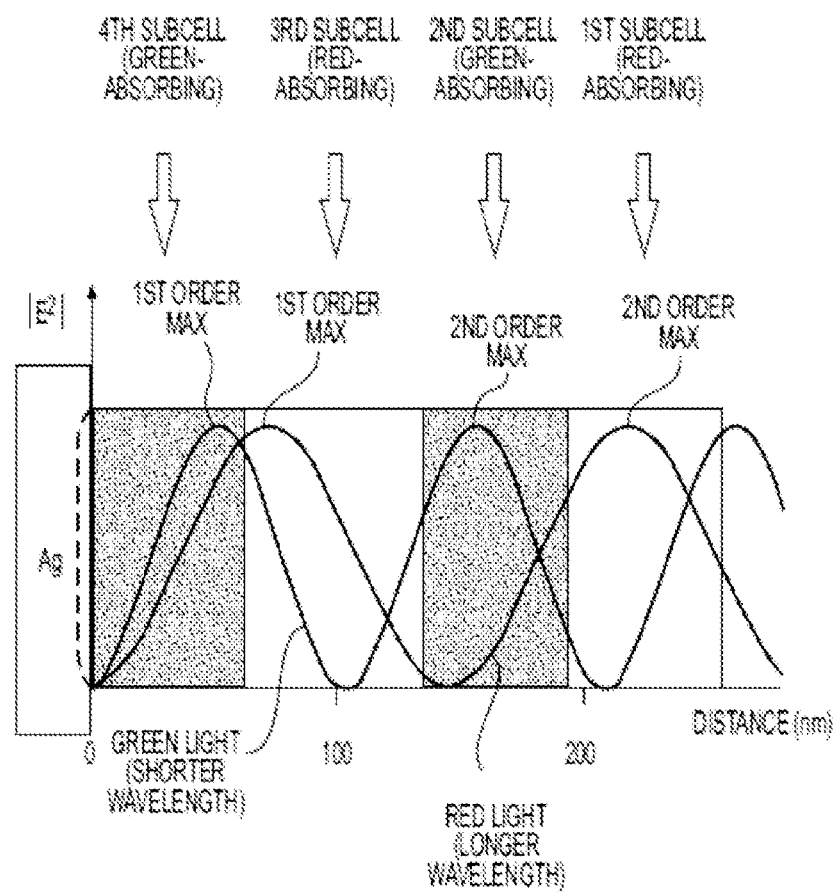

FIG. 9 provides an example schematic of a four-junction device and illustrates the optical interference maxima according to design considerations disclosed herein.

The terms "electrode" and "contact" are used herein to refer to a layer that provides a medium for delivering photo-generated current to an external circuit or providing a bias current or voltage to the device. That is, an electrode, or contact, provides the interface between the photoactive regions of an organic photosensitive optoelectronic device and a wire, lead, trace or other means for transporting the charge carriers to or from the external circuit. Anodes and cathodes are examples.

In a photosensitive optoelectronic device, it may be desirable to allow the maximum amount of ambient electromagnetic radiation from the device exterior to be admitted to the photoconductive active interior region. That is, the electromagnetic radiation must reach the photoactive layers, where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the incident electromagnetic radiation in relevant wavelengths to be transmitted through it. An electrode is said to be "semi-transparent" when it permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the photovoltaic device that absorbs electromagnetic radiation to generate excitons. Similarly, a layer is "photoactive" if it absorbs electromagnetic radiation to generate excitons. The excitons may dissociate into an electron and a hole in order to generate an electrical current.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

When an OPV is said to have "subcells," as that term is used herein, the individual subcells refer to each respective photoactive region in the photovoltaic device, each containing a donor-acceptor heterojunction.

As used herein, a "small-molecule material" refers to any organic material that is not a polymer, and "small molecules" may actually be quite large. Small molecules may include repeat units in some circumstances. Small molecules may include monomers, dimers, oligomers, and dendrimers, for example. In general, a small molecule has a defined chemical formula with a molecular weight that is the same from molecule to molecule, whereas a polymer has a defined chemical formula with a molecular weight that may vary from molecule to molecule.

As used herein, the term "optical interference maxima" refers to points within the device where the optical field intensity is highest for a particular wavelength. For example, as a general rule, the first order optical interference maximum occurs at $\lambda/4$ n, and the second order optical interference maximum occurs at $3\lambda/4$ n, where $\lambda$ is the wavelength and n is the index of refraction of the device layer. As one of ordinary skill in the art will appreciate, determining the exact positions for the interference maxima may necessitate accounting for multiple indices of refraction as the light waves pass through multiple materials.

As used herein, the "principal absorption" of a material refers to a 100 nm spectral range centered at the absorption peak of the material. Accordingly, as used herein, a material "principally absorbs" at wavelengths within 100 nm centered at its peak absorption. When a material is said to "principally absorb" in a particular region of the spectrum (e.g., green spectrum), this means that within the material's "principal absorption," the material absorbs more electromagnetic radiation in that particular spectral region than any other spectral region.

Figure 1:
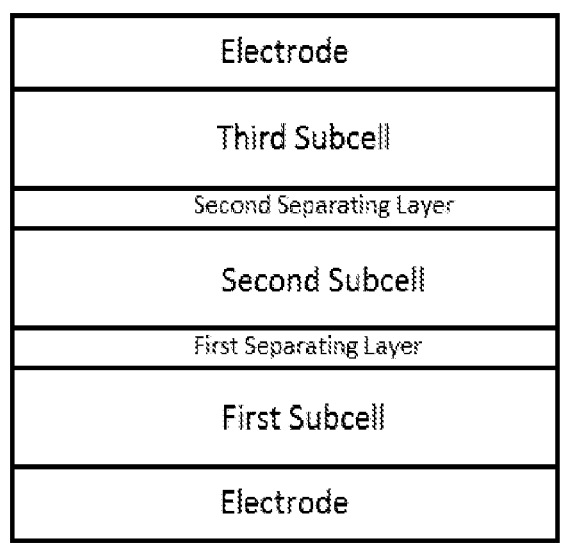
FIG. 1 shows an exemplary device schematic of a triple-junction OPV according to the present disclosure.

As shown in FIG. 1, there is disclosed an organic photovoltaic device comprising two electrodes in superposed relation; a first subcell; a second subcell; a third subcell; a first separating layer; and a second separating layer, wherein the first, second, and third subcells are located between the two electrodes, the second subcell is located between the first and third subcells, the first separating layer separates the first and second subcells, and the second separating layer separates the second and third subcells.

The first subcell comprises a first organic donor and a first organic acceptor forming a first donor-acceptor heterojunction. The second subcell comprises a second organic donor and a second organic acceptor forming a second donor-acceptor heterojunction. The third subcell comprises a third organic donor and a third organic acceptor forming a third donor-acceptor heterojunction.

At least one of the first, second, and third subcells comprises small-molecule materials (i.e., small-molecule donor and acceptor materials). In some embodiments, at least two of the subcells comprise small-molecule materials. For example, the first subcell may comprise a polymer material and the second and third subcells may comprise small-molecule materials. In certain embodiments, the two electrodes, the first, second, and third subcells, and the first and second separating layers are disposed over a substrate such that the first subcell is positioned closer to the substrate than the second and third subcells. In some of these embodiments, the first subcell comprises a polymer material. In this way, the solution-processed first subcell can be fabricated prior to deposition of the remaining subcells to minimize potential damage caused by exposure to liquid solvents.

In some embodiments, all three of the first, second, and third subcells comprise small-molecule materials.

Suitable examples of small-molecule donor materials for use in the presently disclosed devices include, but are not limited to, phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, diindenoperylene (DIP), squaraine (SQ) dyes, tetraphenyldibenzoperiflanthene (DBP), 2-((7-(5-(dip-tolylamino) thiophen-2-yl)benzo[c][1,2,5]thiadiazol-4-yl)methylene) malononitrile (DTDCTB), 2-[(7-{44N,N-Bis(4-methylphenyl)amino]phenyl}-2,1,3-benzothiadiazol-4-yl) methylene]propanedinitrile (DTDCPB), and derivatives thereof. Examples of squaraine donor materials include but are not limited to 2,4-bis [4-(N,N-dipropylamino)-2,6-dihydroxyphenyl] squaraine, 2,4-bis[4-(N,Ndiisobutylamino)-2, 6-dihydroxyphenyl] squaraine, 2,4-bis[4-(N,N-diphenylamino)-2,6-dihydroxyphenyl] squaraine (DPSQ). FIG. 2 provides the chemical structures for DBP, DTDCTB, and DTDCPB.

Suitable examples of small-molecule acceptor materials for use in the presently disclosed devices include, but are not limited to, fullerenes and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as [6,6]-Phenyl-$C_{61}$-Butyric-Acid-Methyl Ester ([60]PCBM), [6,6]-Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof.

In some embodiments, each of the first, second, and third acceptors are chosen from fullerenes and derivatives thereof. In certain embodiments, each of the first, second, and third acceptors are chosen from $C_{60}$ and $C_{70}$.

In some embodiments, one, two, or all three of the first, second, and third donors is/are chosen from DTDCTB, DBP, DTDCPB, and derivatives thereof.

The first, second, and third donor-acceptor heterojunctions may be independently chosen from those known in the art, such as a planar heterojunction, a bulk heterojunction, a mixed heterojunction, and a hybrid planar-mixed heterojunction. The hybrid planar-mixed heterojunction, in addition to the mixed donor-acceptor region, employs a neat (homogenous) donor and/or acceptor that clad(s) the mixed region. In certain hybrid planar-mixed heterojunctions, the neat donor and/or acceptor that clad(s) the mixed region comprises the same donor and/or acceptor material of the mixed region. In some embodiments, one, two, or all three of the first, second, and third donor-acceptor heterojunctions is/are hybrid planar-mixed heterojunctions.

The subcells may be electrically connected in parallel or in series. The separating layers as referred to herein serve to separate the subcells from one another. The separating layers may each comprise at least one charge transfer layer, at least one electrode, or at least one charge recombination layer.

A charge recombination layer allows electrons flowing from one subcell to recombine with holes flowing from an adjacent subcell. In some embodiments, the charge recombination layer may comprise metal nanoclusters, nanoparticles, or nanorods. In some embodiments, the charge recombination layer comprises a thin metal layer. In certain embodiments, the metal is chosen from Ag, Li, LiF, Al, Ti, and Sn. In certain embodiments, the charge recombination layer is less than or equal to about 20 Å thick, such as, for example, less than or equal to about 15 Å, 10 Å, or 5 Å thick. The small thickness ensures that sufficient light passes between subcells.

In some embodiments, the first separating layer comprises a first charge recombination layer and the second separating layer comprises a second charge recombination layer. In some embodiments, the first and second charge recombination layers each comprise a thin metal layer. In certain embodiments, each of the thin metal layers has a thickness of 20 Å or less, such as 15 Å or less, or 10 Å or less. In certain embodiments, each of the thin metal layers is chosen from Ag, Li, LiF, Al, Ti, and Sn. In certain embodiments, each of the thin metal layers comprises Ag.

The separating layers may each further comprise a layer that blocks excitons while conducting the appropriate charge carrier. It is important that these layers be minimally absorbing to permit the maximum amount of electromagnetic radiation to pass between the subcells. Exciton-blocking charge-carrier filters, i.e., exciton-blocking electron filters and exciton-blocking hole filters as described in International Publication No. WO2014/169270 and International Application No. PCT/US2014/062351, incorporated herein by reference, are suitable, exemplary options for these layers. These exciton-blocking electron/hole filters comprise a mixture of a wide energy gap material and either an electron conducting material or a hole conducting material depending on the appropriate charge carrier to be conducted according to the device configuration. The wide energy gap material blocks excitons while the electron conducting material or hole conducting material transport electrons or holes, respectively, to, e.g., a charge recombination layer.

Suitable wide energy gap materials include, but are not limited to, bathocuproine (BCP), bathophenanthroline (BPhen), p-Bis(triphenylsilyl)benzene (UGH-2), (4,4'-N,N'-dicarbazole)biphenyl (CBP), N,N'-dicarbazolyl-3,5-benzene (mCP), phenanthrene and alkyl and/or aryl substituted phenanthrenes, alkyl and/or aryl substituted derivatives of benzene, triphenylene and alkyl and/or aryl substituted triphenylenes, aza-substituted triphenylenes, oxidiazoles, triazoles, aryl-benzimidazoles, adamantane and alkyl and/or aryl substituted adamantanes, tetraarylmethane and its derivatives, 9,9-dialkyl-fluorene and its oligomers, 9,9-diaryl-fluorene and its oligomers, spiro-biphenyl and substituted derivatives, corannulene and its alkyl and/or aryl substituted derivatives, and derivatives thereof.

In some embodiments, the electron conducting material or the hole conducting material in the exciton-blocking charge-carrier filter comprises the same material as the acceptor or donor in the adjacent subcell. In certain embodiments, the electron conducting material is a fullerene, e.g., $C_{60}$. The first and second separating layers may, but need not, comprise the same materials. It is possible for the separating layer to comprise both an exciton-blocking electron filter and an exciton-blocking hole filter. The exciton-blocking electron filter block excitons and conduct electrons from one subcell while the exciton-blocking hole filter blocks excitons and conduct holes from an adjacent subcell.

Examples of separating layers are shown in the sample device schematic in FIG. 3A, where a first separating layer and a second separating layer each comprise a thin Ag charge recombination layer and a Bphen:$C_{60}$ exciton-blocking electron filter.

In accordance with the need to maximize the amount of electromagnetic radiation absorbed by an OPV, the present disclosure describes multi-junction OPV designs to improve cell performance.

One design selects three donor materials to minimize overlap in their absorption spectra, allowing for balanced absorption and current generation in each subcell. Thus, under this first design consideration, the first, second, and third donors each principally absorb at non-overlapping wavelengths. That is, each of the first, second, and third donors has a principal absorption that does not overlap with the other two. In some embodiments, two of the first, second, and third donors are chosen from small-molecule materials. In some embodiments, all of the first, second, and third subcells are chosen from small-molecule materials.

In some embodiments, the three donors each principally absorb at an optical interference maximum at one or more wavelengths within their respective principal absorptions. In certain embodiments, the three donors each principally absorb at the first order optical interference maximum at one or more wavelengths within their respective principal absorptions.

As an example of the first design consideration, the first, second, and third donors may be chosen such that one donor principally absorbs in the NIR spectrum, one principally absorbs in the red spectrum, and one principally absorbs in the green spectrum. In certain embodiments, the first donor principally absorbs in the NIR spectrum, the second donor principally absorbs in the red spectrum, and the third donor principally absorbs in the green spectrum. In further embodiments, the electrode nearest the third subcell is a reflective electrode. In certain embodiments, that electrode is a cathode or in other embodiments is an anode. In certain embodiments, the donor that principally absorbs in the NIR spectrum comprises a polymer material. In certain embodiments, the donor that principally absorbs in the NIR spectrum comprises carbon nanotubes in a polymer matrix. In certain embodiments, the donor that principally absorbs in the NIR spectrum comprises quantum dots, such as PbS quantum dots.

In some embodiments, one or two of the first, second, and third donors are chosen from DTDCTB, DBP, DTDCPB, and derivatives thereof. DTDCTB principally absorbs in the red spectrum, and DBP and DTDCPB principally absorb in the green spectrum. In certain embodiments, one of the donors comprises DTDCTB or a derivative thereof and another of the donors comprises DBP, DTDCPB, or a derivative thereof. In certain embodiments, one of the donors comprises DTDCTB or a derivative thereof, another of the donors comprises DBP, DTDCPB, or a derivative thereof, and the last of the donors comprises a material that principally absorbs in the NIR spectrum.

In some embodiments, the third donor comprises DBP, DTDCPB, or a derivative thereof and the second donor comprises DTDCTB. In some embodiments, the third donor comprises DBP, DTDCPB, or a derivative thereof, the second donor comprises DTDCTB, and the first donor comprises a material that principally absorbs in the NIR spectrum. In certain embodiments, the electrode nearest the third subcell is a reflective electrode. In certain embodiments, that electrode is a cathode or in other embodiments is an anode.

One example of an OPV according to this first design consideration is shown in FIG. 4A, where the first donor constitutes a material that principally absorbs in the NIR spectrum, the second donor is DTDCTB (red absorbing), and the third donor is DBP (green absorbing).

It should be understood that numerous material combinations are contemplated according to this first design consideration. For example, SubPc (absorption peak: 580 nm) could be used in combination with ZnPc (absorption peak: 700 nm), ClAlPc (absorption peak: 750 nm), or PbPc (absorption peak: 850 nm), and an NIR absorbing material such as PbS (absorption peak: 950 nm) or porphyrin-tape (absorption peak: 1350 nm).

The first design consideration may also be applied to the first, second, and third acceptors such that the acceptors principally absorb at non-overlapping wavelengths.

In other embodiments, overlapping acceptors are used, as shown in FIG. 4A. In some embodiments, each of the first, second, and third acceptors are chosen from fullerenes and derivatives thereof. In certain embodiments, each of the first, second, and third acceptors are chosen from $C_{60}$ and $C_{70}$.

It should be noted that fullerene $C_{60}$ absorbs at about 360 nm wavelength and about 450 nm wavelength, corresponding to Frenkel-type and intermolecular charge transfer (CT) exciton features, respectively. The CT absorption results from electrons excited from the highest occupied molecular orbital of one molecule to the lowest unoccupied molecular orbital of a nearby $C_{60}$ molecular. As previously demonstrated, the $C_{60}$ CT peak at $\lambda=450$ nm is significantly reduced in mixed donor-acceptor heterojunctions, even at modest dilutions. See International Application No. PCT/US2014/062354. Thus, mixed heterojunctions and hybrid planar-mixed heterojunctions can reduce potential losses caused by overlapping absorption at the CT absorption wavelength, such as by reducing potential overlapping absorption with blue/green absorbing donors.

A second design consideration according to the present disclosure permits overlap in the absorption spectra of donor materials but uses the optical field distribution at each interference maximum to maximize absorption of electromagnetic radiation. By absorbing at different optical interference maxima, subcells with overlapping absorption can efficiently harvest light.

Thus, in some embodiments of the triple-junction OPV, the first, second, and third donors principally absorb at one or more overlapping wavelengths, and the first, second, and third subcells are positioned at different optical interference maxima within the one or more overlapping wavelengths. In some embodiments, the first, second, and third donors are chosen from small-molecule materials. In some embodiments, the first, second, and third donors comprise the same small-molecule material.

In other embodiments, only two of the first, second, and third donors principally absorb at one or more overlapping wavelengths, and the subcells corresponding to the two donors that principally absorb at the one or more overlapping wavelengths are positioned at different optical interference maxima within the one or more overlapping wavelengths. For instance, one of the two donors may absorb at the first order optical interference maximum within the one or more overlapping wavelengths, and the second of the two may absorb at the second order optical interference maximum within the one or more overlapping wavelengths. This configuration allows two donors with overlapping absorption to efficiently harvest light, while at the same time a third donor does not principally absorb at the one or more overlapping wavelengths. That is, the third donor can principally absorb in a different part of the spectrum to complement the absorption of the other donors. In some embodiments, the donor that does not principally absorb at the one or more overlapping wavelengths principally absorbs at the first optical interference maximum at one or more wavelengths within its principal absorption. In some embodiments, the first, second, and third donors are chosen from small-molecule materials. In certain embodiments, the two donors principally absorbing at one or more overlapping wavelengths comprise the same small-molecule material.

In some embodiments, the first and third donors principally absorb at one or more overlapping wavelengths, and the first and third subcells are positioned at different optical interference maxima within the one or more overlapping wavelengths. For example, the first and third donors may principally absorb shorter wavelengths (e.g., the green spectrum) and absorb at different optical interference maxima, while the second donor principally absorbs at longer wavelengths (e.g., red spectrum). In further embodiments, the electrode nearest the third subcell is a reflective electrode. In further embodiments, that electrode is a cathode or in other embodiments is an anode.

In some embodiments, one, two, or all three of the first, second, and third donors is/are chosen from DTDCTB, DBP, DTDCPB, and derivatives thereof. In certain embodiments, one of the donors comprises DTDCTB or a derivative thereof and another of the donors comprises DBP, DTDCPB, or a derivative thereof. In certain embodiments, two of the donors comprise DTDCTB or a derivative thereof and one of the donors comprises DBP, DTDCPB, or a derivative thereof. In certain embodiments, two of the donors comprise DBP, DTDCPB, or a derivative thereof and one of the donors comprises DTDCTB. In certain embodiments, the first and third donors comprise DBP, DTDCPB, or a derivative thereof. In certain embodiments, the second donor comprises DTDCTB. In further embodiments, the electrode nearest the third subcell is a reflective electrode. In further embodiments, that electrode is a cathode or in other embodiments is an anode.

Subcells may be positioned at appropriate optical interference maxima by, for example, controlling the thickness of the subcells such that maxima fit within the proper subcells, and/or by using other device layers (buffer layers, etc.) as optical spacers.

An example according to this second design consideration for a triple-junction cell is shown in FIG. 3A, where the first and third donors are the principally green-absorbing DBP and the second donor is the principally red-absorbing DTDCTB. The first and third donors therefore exhibit overlapping absorption spectra. To efficiently harvest light, the back subcell (nearest the Ag cathode) and the front subcell (nearest the transparent ITO anode) fit into the first and second orders of optical interference maxima, respectively.

In some embodiments, as shown in FIG. 3A, each of the first, second, and third acceptors are chosen from fullerenes or derivatives thereof. In certain embodiments, each of the first, second, and third acceptors are chosen from $C_{60}$ and $C_{70}$.

The second design consideration is also practical for the construction of multi-junction OPVs comprising four or more subcells. As shown in FIG. 5, there is disclosed an organic photovoltaic device comprising two electrodes in superposed relation; a first subcell; a second subcell; a third subcell; a fourth subcell; a first separating layer; a second separating layer; and a third separating layer, wherein the first, second, third, and fourth subcells are located between the two electrodes, the second subcell is located between the first and third subcells, the third subcell is located between the second and fourth subcells, the first separating layer separates the first and second subcells, the second separating layer separates the second and third subcells, and the third separating layer separates the third and fourth subcells.

The first subcell comprises a first organic donor and a first organic acceptor forming a first donor-acceptor heterojunction. The second subcell comprises a second organic donor and a second organic acceptor forming a second donor-acceptor heterojunction. The third subcell comprises a third organic donor and a third organic acceptor forming a third donor-acceptor heterojunction. The fourth subcell comprises a fourth organic donor and a fourth organic acceptor forming a fourth donor-acceptor heterojunction.

In some embodiments, three or all four of the subcells comprise small-molecule materials. Examples of suitable donor and acceptor small-molecule materials include, but are not limited to, those described above. Examples of suitable donor-acceptor heterojunctions are described above. In certain embodiments, one, two, three, or all four of the donor-acceptor heterojunctions is/are chosen from mixed heterojunctions and hybrid planar-mixed heterojunctions.

The first, second, and third separating layers may be chosen, for example, according to the disclosure described above for separating layers.

In accordance with the second design consideration, two or more of the first, second, third, and fourth donors principally absorb at one or more overlapping wavelengths. The subcells corresponding to the donor materials that principally absorb at one or more overlapping wavelengths are positioned at different optical interference maxima within the one or more overlapping wavelengths.

In certain embodiments, two of the donors principally absorb at one or more first overlapping wavelengths and another two of the donors principally absorb at one or more second overlapping wavelengths. The subcells corresponding to the donor materials that principally absorb at the one or more first overlapping wavelengths are positioned at different optical interference maxima within the one or more first overlapping wavelengths. The subcells corresponding to the donor materials that principally absorb at the one or more second overlapping wavelengths are positioned at different optical interference maxima within the one or more second overlapping wavelengths. This configuration allows for wide spectral coverage while also efficiently absorbing at overlapping wavelengths.

For example, under the second design consideration, the first and third donors may principally absorb at one or more first overlapping wavelengths (in some embodiments, at longer wavelengths, e.g., in the red spectrum) and the second and fourth donors may principally absorb at one or more second overlapping wavelengths (in some embodiments, at shorter wavelengths, e.g., in the green spectrum). The first and third subcells may be positioned at different optical interference maxima within the one or more first overlapping wavelengths, and the second and fourth subcells may be positioned at different optical interference maxima within the one or more second overlapping wavelengths. In certain embodiments, the electrode nearest the fourth subcell is a reflective electrode. In further embodiments, that electrode is a cathode or in other embodiments is an anode. In further embodiments, the first and third subcells are positioned at the second order and first order optical interference maxima, respectively, within the one or more first overlapping wavelengths, and the second and fourth subcells are positioned at the second order and first order optical intereference maxima, respectively, within the one or more second overlapping wavelengths.

FIG. 9 provides an example schematic of a four-junction device showing the optical interference maxima in accordance with the second design consideration. The green light, which has a shorter wavelength, has a first order optical interference maximum nearer to the Ag cathode. The fourth subcell fits within this first maximum and is chosen to be green-absorbing. The third subcell is a red-absorbing subcell and fits within the first order optical interference maximum of the red light. The second subcell is another green-absorbing subcell and is positioned such that it fits within the second order optical interference maximum of the green light. Lastly, the first subcell is another red-absorbing subcell and fits within the second order optical interference maximum of the red light.

A specific example according to the second design consideration for a four-junction OPV is shown in FIG. 6A, where the first and third donors are the principally red-absorbing DTDCTB, and the second and fourth donors are the principally green-absorbing DBP. The first and third donors and the second and fourth donors therefore exhibit overlapping absorption spectra. To efficiently harvest light, the first and third subcells fit into the second and first orders of optical interference maxima, respectively, and the second and fourth subcells fit into the second and first orders of optical interference maxima, respectively.

Alternatively, at least two of the donors may principally absorb at one or more overlapping wavelengths and another one or two of the donors do not principally absorb at the one or more overlapping wavelengths. These one or two other donors may principally absorb in another portion of the spectrum, complementing the absorption of the overlapping donors.

In some embodiments, all of the donors are chosen from small-molecule materials. In some embodiments, the donor materials with overlapping principal absorptions comprise the same material. In some embodiments, one, two, three, or all four of the donors are chosen from DTDCTB, DBP, DTDCPB, and derivatives thereof. In some embodiments, two of the donors are chosen from DTDCTB, DBP, DTDCPB, and derivatives thereof. In certain embodiments, one of the donors is DTDCTB or a derivative thereof and another of the donors is DBP, DTDCPB, or a derivative thereof. In certain embodiments, two of the donors are chosen from DTDCTB and derivatives thereof, and one or two of the other donors is/are chosen from DBP, DTDCPB, and derivatives thereof. In certain embodiments, two of the donors comprise DBP, DTDCPB, or a derivative thereof and one or two of the other donors comprises DTDCTB. In certain embodiments, the first and third donors comprise DTDCTB or a derivative thereof. In certain embodiments, the second and fourth donors comprise DBP, DTDCPB, or a derivative thereof. In certain embodiments, the electrode nearest the fourth subcell is a reflective electrode. In further embodiments, that electrode is a cathode or in other embodiments is an anode.

In some embodiments, as shown in FIG. 6A, the first, second, and third acceptors are chosen from fullerenes and derivatives thereof. In certain embodiments, the first, second, and third acceptors are chosen from $C_{60}$ and $C_{70}$.

A person of ordinary skill in the art will understand from the present disclosure that a multitude of various OPV material and structure combinations are contemplated under this design consideration, including multi-junction OPV devices with five or more subcells.

For example, additional subcells and separating layers may be added to the device structure in FIG. 5. Thus, there is disclosed a multi-junction organic photovoltaic device comprising two electrodes in superposed relation and five or more subcells located between the electrodes, wherein each pair of adjacent subcells is separated by a separating layer, as described herein. Two or more of the subcells (e.g., at least three subcells) each comprise a donor that principally absorbs at one or more first overlapping wavelengths, wherein each of the subcells that comprise a donor that principally absorbs at the one or more first overlapping wavelengths are positioned at different optical interference maxima within the one or more first overlapping wavelengths.

In some embodiments, another two or more subcells (e.g., at least three subcells) each comprise a donor that principally absorbs at one or more second overlapping wavelengths, wherein each of the subcells that comprise a donor that principally absorbs at the one or more second overlapping wavelengths are positioned at different optical interference maxima within the one or more second overlapping wavelengths. In some embodiments, one or more subcells each comprise a donor having absorption spectra that do not substantially overlap with any other donor. The five or more subcells may each comprise materials chosen from small-molecule materials. In certain embodiments, the donors with overlapping principal absorption spectra comprise the same material.

One of the electrodes in the presently disclosed devices may be an anode, and the other electrode a cathode. It should be understood that the electrodes should be optimized to receive and transport the desired carrier (holes or electrons). The term "cathode" is used herein such that in a single-junction PV device or a single unit of a multi-junction PV device under ambient irradiation and connected with a resistive load and with no externally applied voltage, electrons move to the cathode from the photoactive region. Similarly, the term "anode" is used herein such that in a PV device under illumination, holes move to the anode from the photoactive region, which is equivalent to electrons moving in the opposite manner.

The multi-junction devices of the present disclosure may further comprise additional layers known in the art for photovoltaic devices, such as various buffer layers. For example, the devices may further comprise charge collection/transporting layers. Charge collection/transporting layers may be located, e.g., between a subcell and an electrode and/or between a subcell and a separating layer, as shown in FIG. 3A. It should be understood that charge collection/transporting layers will be chosen according to the desired carrier to be collected/transported. Examples of charge collecting/transporting layers include, but are not limited to, metal oxides. In certain embodiments, the metal oxides are chosen from $MoO_3$, $V_2O_5$, ZnO, and $TiO_2$.

As a further example, the devices may include exciton-blocking layers, including exciton-blocking charge-carrier filters, in addition to any exciton-blocking charge-carrier filters present in the separating layers. With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris (acetylacetonato) ruthenium(III) (Ru(acac)3), and aluminum (III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). FIG. 3A, for example, includes a BPhen exciton-blocking layer between the third subcell and Ag cathode.

These buffer layers may also serve as optical spacers to control the optical field distribution in the multi-junction devices according to the design considerations disclosed herein.

Layers and materials may be deposited using techniques known in the art. For example, the layers and materials described herein can be deposited or co-deposited from a solution, vapor, or a combination of both. In some embodiments, organic materials or organic layers are deposited or co-deposited using vacuum thermal evaporation, organic vapor phase deposition, or organic vapor-jet printing.

A particular advantage of the small-molecule multi-junction OPVs of the present disclosure is that the subcells may be deposited using vacuum thermal evaporation. The vacuum thermal evaporation method for small-molecules can achieve thicker structure without damaging the previously deposited layers, which is important for a stacked device.

Thus, there is disclosed a method of fabricating a multi-junction organic photovoltaic device, comprising depositing a first subcell over a first electrode, depositing a first separating layer over the first subcell, depositing a second subcell over the first separating layer, depositing a second separating layer over the second subcell, depositing a third subcell over the second separating layer, and depositing a second electrode over the third subcell, wherein each of the subcells comprises materials chosen from small molecule materials. In some embodiments, each of the subcells is deposited by vacuum thermal evaporation. Additional subcells and separating layers may be deposited prior to depositing the second electrode.

In some embodiments, the first electrode is disposed over a substrate such that the first subcell is positioned closer to the substrate than the second and third subcells. In certain of these embodiments, the second and third subcells comprise small-molecule materials. In certain embodiments, the second and third subcells are deposited by vacuum thermal evaporation. In certain embodiments, the first subcell is deposited via solution processing. In this way, the solution-processed subcell can be fabricated prior to deposition of the remaining subcells to minimize potential damage caused by exposure to liquid solvents.

There is also disclosed a method of fabricating a multi-junction organic photovoltaic device, comprising depositing four or more subcells over a first electrode and depositing a second electrode over the four or more subcells, wherein each adjacent pair of the subcells is separated by a separating layer, and wherein each of the subcells comprises materials chosen from small-molecule materials.

Additional materials/layers may be deposited as known in the art (e.g., charge transport buffer layers and/or exciton-blocking buffer layers).

In addition, the layers and materials may be deposited according to the design considerations disclosed herein, which will not be repeated here.

It should be understood that embodiments described herein may be used in connection with a wide variety of structures. Functional organic photovoltaic devices may be achieved by combining the various layers described in different ways, or layers may be omitted based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLE 1

An exemplary triple-junction OPV was designed according to the first design consideration, and a device schematic is shown in FIG. 4A. The device included an ITO anode and Ag cathode, three subcells, two separating layers each comprising a highly transparent Bphen:$C_{60}$ exciton-blocking electron filter and a thin Ag recombination layer, $MoO_3$ buffer layers, and a Bphen exciton-blocking layer. Each subcell was a hybrid planar-mixed heterojunction with fullerene acceptors (either $C_{60}$ or $C_{70}$) in the mixed region and a neat fullerene layer (either $C_{60}$ or $C_{70}$ cladding the mixture). The donor in each subcell exhibited non-overlapping absorption spectra, thus allowing for balanced absorption and current generation in each subcell.

Specifically, the calculated absorption spectra for the device, including each subcell, is shown in FIG. 4B. The first donor was a simulated NIR-absorbing material, the second donor (DTDCTB) principally absorbed in the red spectrum, and the third donor (DBP) principally absorbed in the green spectrum. Intense absorption in FIG. 4B is indicated by the darker shade within the absorption bands. As shown, the Bphen:$C_{60}$ layers were highly transparent.

Structure optimization and device performance simulations were performed using Matlab® based on the transfer-matrix approach and the genetic algorithm method, with the exciton diffusion and carrier collection lengths as parameters. The real and imaginary indices of refraction, n and k, respectively, for 30 nm thin films deposited on silicon substrate were measured (at wavelength of 300-1600 nm) by ellipsometry using the Cauchy model with Gaussian oscillators. To determine optimal structure for current matching and efficiency, the light intensity dependent J-V data was used from the constitutent subcells. Both calculated quantum efficiency and cell performance were simulated using an AM 1.5 G spectrum The modeling suggested that a non-optimized device according to the present example will have a power conversion efficiency of 16% at 1 sun illumination intensity. Optimization is expected to push efficiencies at or greater than 20%.

EXAMPLE 2

An exemplary triple-junction OPV was fabricated according to the second design consideration, and a device schematic is shown in FIG. 3A. The device included an ITO anode and Ag cathode, three subcells, two separating layers each comprising a highly transparent Bphen:$C_{60}$ exciton-blocking electron filter and a thin Ag recombination layer, $MoO_3$ buffer layers, and a Bphen exciton-blocking layer. Two types of subcells were used: DBP:$C_{70}$ hybrid planar-mixed heterojunction and DTDCTB:$C_{60}$ hybrid planar-mixed heterojunction.

The calculated absorption spectra for the device, including for each subcell, is shown in FIG. 3B. The red-absorbing DTDCTB:$C_{60}$ subcell was placed in the middle for absorption at the first order optical interference maximum, while green-absorbing DBP:$C_{70}$ subcells were placed as the front and back subcells and the thicknesses controlled such they fit into the second and first order optical interference maximums, respectively. The front and back green-absorbing cells therefore absorb at different optical maxima to efficiently harvest short wavelength photons while complementing the absorption of the middle red-absorbing cell. As shown in FIG. 3B, the Bphen:$C_{60}$ exciton-blocking electron filters were highly transparent and therefore lossless, improving light harvest efficiency.

Both simulated and experimental data were generated for the device. Structure optimization and device performance simulations were performed using Matlab® based on the transfer-matrix approach and the genetic algorithm method, with the exciton diffusion and carrier collection lengths as parameters. The real and imaginary indices of refraction, n and k, respectively, for 30 nm thin films deposited on silicon substrate were measured (at wavelength of 300-1600 nm) by ellipsometry using the Cauchy model with Gaussian oscillators. To determine optimal structure for current matching and efficiency, the light intensity dependent J-V data was used from the constitutent subcells. Both calculated quantum efficiency and cell performances were simulated using an AM 1.5 G spectrum. The spectral mismatch factor was obtained from the simulated $\eta_P$ from the simulator spectrum divided by rip based on the reference AM 1.5 G solar spectrum.

FIG. 7 shows the simulated quantum efficiency for the triple-junction device compared to the simulated quantum efficiency for the four-junction device described below in Example 3. FIG. 8 shows the measured current density vs. voltage (J-V) characteristics for the triple-junction device compared to the four-junction device. From the calculated quantum efficiency, the triple-junction device covered a large range of the solar spectrum from about 300 nm to about 900 nm and reached nearly 100% from about 400 nm to 600 nm due to contributions from the two DBP:$C_{70}$ subcells at the different interference maxima. The overall triple-junction device efficiency was measured at 11.1%. Table 1 lists simulated and experimental Jsc, Voc, FF, and PCE for the device.

TABLE 1

| | Triple-Junction OPV | | | |
| --- | --- | --- | --- | --- |
| | $J_{SC}$ | $V_{OC}$ | FF | PCE (%) |
| Simulation | 7.7 | 2.62 | 0.61 | 12.3 |
| Experiment | 7.3 | 2.58 | 0.59 | 11.1 |

EXAMPLE 3

An exemplary four-junction OPV was fabricated according to the second design consideration, and a device schematic is shown in FIG. 6A. The device included an ITO anode and Ag cathode, four subcells, three separating layers each comprising a highly transparent Bphen:C60 exciton-blocking electron filter and a thin Ag recombination layer, $MoO_3$ buffer layers, and a Bphen exciton-blocking layer.

The four-junction device contained the same subcell configuration as the triple-junction device, except that a second red-absorbing DTDCTB:$C_{60}$ subcell was added as the front subcell (nearest the ITO anode) at the second interference maximum.

The calculated absorption spectra for the device, including for each subcell, is shown in FIG. 6B. The first and third red-absorbing subcells absorb at different optical interference maxima, while the second and fourth green-absorbing subcells absorb at different optical interference maxima. As shown, the Bphen:$C_{60}$ exciton-blocking electron filters were highly transparent and therefore lossless, improving light harvest efficiency.

Both simulated and experimental data were generated for the device. Structure optimization and device performance simulations were performed as described above.

FIG. 7 shows the simulated quantum efficiency for the four-junction device compared to the three-junction device. FIG. 8 shows the measured current density vs. voltage (J-V) characteristics for the four-junction device compared to the three-junction device. The quantum efficiency for the four-junction device was boosted close to 100% for longer wavelengths (about 600 nm to 700 nm), which almost fully utilizes the optical field in the first and second order optical periods. The overall four-junction device efficiency was measured at 12.6%, believed to be the highest among OPVs reported in the scientific literature. Structural optimization is expected to further increase the PCE. Table 2 lists simulated and experimental $J_{SC}$, $V_{OC}$, FF, and PCE for the device.

TABLE 2

| Quad-Junction OPV | | | | |
|---|---|---|---|---|
| | $J_{SC}$ | $V_{OC}$ | FF | PCE (%) |
| Simulation | 6.7 | 3.44 | 0.61 | 14.0 |
| Experiment | 6.4 | 3.38 | 0.58 | 12.6 |

Experimental Section

Devices were grown on indium tin oxide (ITO, sheet resistance of 15 Ω/sq.) coated glass substrates. All the chemicals were obtained from commercial suppliers. Prior to use, DTDCTB, DBP, $C_{60}$ and $C_{70}$ were purified once using the temperature-gradient sublimation.

Prior to thin film deposition, the ITO surface was cleaned in a series of detergents and solvents and treated with ultraviolet-ozone for 10 min. prior to thin film deposition. All neat films were deposited using vacuum thermal evaporation in a chamber with a base pressure of $\approx 10^{-7}$ Torr at a rate of 0.1 nm/s, except for the Ag nanoparticle charge recombination layer that was deposited at 0.005 nm/s. The components of the DTDCTB:$C_{60}$ and Bphen:$C_{60}$ layers were co-deposited at 0.1 nm/s, and DBP:$C_{70}$ at 0.2 nm/s, with the rate for each material adjusted to achieve the desired volume ratio. The growth rates and thicknesses were monitored using quartz crystal monitors and calibrated by ex situ variable-angle spectroscopic ellipsometry. The 100 nm thick Ag cathodes were deposited through a shadow mask with an array of circular, 1 mm diameter openings that defined the device areas. The device diameters were measured using an optical microscope and ranged from 0.98 mm to 1 mm. This 3-4% device area variation was included in the systematic error calculations.

Following cathode deposition, samples were transferred into a glove box filled with ultrapure (<0.1 ppm) $N_2$ for testing. The J-V characteristics were obtained for both the single- and multi-junction cells. Measurements were performed vs. light intensity using AM 1.5 G solar illumination (ASTM G173-03) from a filtered Xe lamp. Intensities were adjusted using neutral density filters with no dependence on spectrum over the range considered. The cell temperature at 1 sun (1000 W/m$^2$) intensity was 25±1° C., with a measurement time of $\approx 10$ s to avoid temperature increase. The intensity was measured using a National Renewable Energy Laboratory (NREL) traceable Si reference cell, with $J_{SC}$ and $\eta_P$ corrected for spectral mismatch. The EQE was measured using monochromated light from a 200 Hz chopped Xe-lamp whose output was focused to under-fill the device area, and was calibrated with a NIST-traceable Si detector. The spectral mismatch factors (M) for the subcells were calculated from the measured responsivity of the samples. Errors in Table 1 correspond to device-to-device variations of $\approx 30$ devices fabricated on a single substrate in the same run, and the measurement of $J_{SC}$ and $\eta_P$ included an additional systematic error of $\approx 5\%$. Devices reported are from the best substrate samples. Structure optimization and device performance simulations were carried out using the method described in Lassiter et al., *Appl. Phys. Lett.*, 2012, 101, 063303 and Lassiter et al., *J. Appl. Phys.*, 2013, 113, 214505.

The device response uniformity was measured using a 2D optical scan of a DBP:$C_{70}$ single junction cell at a wavelength of 500 nm. The light from a monochrometer was coupled to the device using an optical fiber with a core diameter of 10 μm. The current vs. fiber position with $\approx 2$ μm spatial resolution was then used to create a map.

Other embodiments of the devices and methods described herein will be apparent to those skilled in the art from consideration of the description and examples. It is intended that the specification be considered as exemplary only, with the true scope of the devices and methods described being indicated by the claims.

What is claimed is:

1. A multi-junction organic photovoltaic device comprising:
    two electrodes in superposed relation;
    a first subcell comprising a first organic donor and a first organic acceptor forming a first donor-acceptor heterojunction;
    a second subcell comprising a second organic donor and a second organic acceptor forming a second donor-acceptor heterojunction;
    a third subcell comprising a third organic donor and a third organic acceptor forming a third donor-acceptor heterojunction;
    a first separating layer; and
    a second separating layer,
    wherein the first, second, and third subcells are located between the two electrodes, the second subcell is located between the first and third subcells, the first separating layer is located between the first and second subcells, the second separating layer is located between the second and third subcells, and at least two of the first, second, and third subcells comprise small-molecule materials;
    wherein the first and third donors principally absorb at one or more overlapping wavelengths, and the first and third subcells are positioned at different optical interference maxima within the one or more overlapping wavelengths;
    wherein the second donor principally absorbs at one or more wavelengths that do not overlap with the one or more overlapping wavelengths principally absorbed by the first and third donors; and
    wherein the first and third donors principally absorb at shorter wavelengths than the second donor.

2. The device of claim 1, wherein the first subcell comprises a polymer material and the second and third subcells comprise small-molecule materials.

3. The device of claim 1, wherein all the first, second, and third subcells comprise small-molecule materials.

4. The device of claim 1, wherein each of the first, second, and third acceptors are chosen from fullerenes and derivatives thereof.

5. The device of claim 4, wherein each of the first, second, and third acceptors are chosen from $C_{60}$ and $C_{70}$.

6. The device of claim 1, wherein at least one of the first, second, and third donors is chosen from DTDCTB, DBP, DTDCPB, and derivatives thereof.

7. The device of claim 6, wherein two or all three of the first, second, and third donors are chosen from DTDCTB, DBP, DTDCPB, and derivatives thereof.

8. The device of claim 1, wherein at least one of the first, second, and third donor-acceptor heterojunctions is a hybrid planar-mixed heterojunction.

9. The device of claim 8, wherein two or all three of the donor-acceptor heterojunctions is a hybrid planar-mixed heterojunction.

10. The device of claim 1, wherein each of the first and second separating layers comprises a charge recombination layer.

11. The device of claim 10, wherein the charge recombination layers comprise a material chosen from Ag, Li, LiF, Al, Ti, and Sn.

12. The device of claim 1, wherein one or both of the first and second separating layers comprises an exciton-blocking charge-carrier filter.

13. The device of claim 1, wherein the first and third-donors comprise the same small-molecule material.

14. The device of claim 13, wherein the same small-molecule material is chosen from DBP, DTDCPB, and derivatives thereof.

15. The device of claim 1, wherein the first and third-donors are chosen from DBP, DTDCPB, and derivatives thereof.

16. The device of claim 15, wherein the second donor is chosen from DTDCTB and derivatives thereof.

17. The device of claim 14, wherein the same small-molecule material comprises DBP.

18. The device of claim 14, wherein the second donor is chosen from DTDCTB and derivatives thereof.

19. The device of claim 17, wherein the second donor comprises DTDCTB.

20. The device of claim 1, wherein the wherein the second subcell is positioned at an optical interference maxima within the one or more wavelengths principally absorbed by the second donor.

21. The device of claim 1, wherein at least one of the first and third donors comprises DBP.

22. The device of claim 1, wherein the first and third donors principally absorb in the green spectrum.

23. The device of claim 22, wherein the second donor principally absorbs in the red spectrum.

* * * * *